United States Patent
Neesgaard

(10) Patent No.: US 6,713,848 B2
(45) Date of Patent: Mar. 30, 2004

(54) OUTPUT STAGE LAYOUT FOR MINIMUM CROSS COUPLING BETWEEN CHANNELS

(75) Inventor: Claus Neesgaard, Allerød (DK)

(73) Assignee: Texas Instruments Incorporated, Dallas, TX (US)

( * ) Notice: Subject to any disclaimer, the term of this patent is extended or adjusted under 35 U.S.C. 154(b) by 88 days.

(21) Appl. No.: 10/145,972

(22) Filed: May 14, 2002

(65) Prior Publication Data

US 2003/0213618 A1 Nov. 20, 2003

(51) Int. Cl.$^7$ ............................................... H01L 29/40
(52) U.S. Cl. .................... 257/664; 257/665; 257/167
(58) Field of Search ................................ 257/664, 665, 257/167; 333/112

(56) References Cited

U.S. PATENT DOCUMENTS 5,006,822 A * 4/1991 Reddy .................. 333/112

* cited by examiner

Primary Examiner—Kamand Cuneo
Assistant Examiner—Luan Thai
(74) Attorney, Agent, or Firm—W. Daniel Swayze, Jr.; W. James Brady; Frederick J. Telecky, Jr.

(57) ABSTRACT

An audio amplifier output stage layout technique achieves minimum cross coupling between audio amplifier channels. Regarding TDAA output stages, the typical TDAA includes two demodulation inductors per audio channel. The two pair of demodulation inductors associated with the TDAA are arranged to form an X-pattern to simultaneously minimize cross coupling between audio amplifier channels and reduce PCB layout size.

20 Claims, 2 Drawing Sheets

OUTPUT STAGE LAYOUT FOR MINIMUM CROSS COUPLING BETWEEN CHANNELS

BACKGROUND OF THE INVENTION

1. Field of the Invention

This invention relates generally to audio amplifiers, and more particularly to a channel-to-channel separation technique to resolve cross coupling problems associated with multi-channel audio amplifier layouts.

2. Description of the Prior Art

Typical true digital audio amplifier (TDAA) systems include two demodulation inductors per audio channel. These demodulation inductors tend to couple in multi-channel boards if they are placed too close to one another; and this characteristic causes inferior channel-to-channel separation and other undesirable artifacts. This cross coupling is particularly problematic when downsizing printed circuit boards (PCBs), since inductors will be then be placed even closer to one another.

Two common techniques have been employed to resolve inductor coupling problems. One technique includes use of fully encapsulated demodulation inductors (in contrast to bar-type, high air-gap inductors). This technique, however, has negative affects on audio performance since it causes and increase in THD. Another technique includes use of large physical PCB spacing between audio channels. This technique is also problematic however, since it has a negative influence on total PCB size, i.e., the amplifier size/power ratio goes up.

In view of the foregoing, it would both desirable and advantageous to provide an inductor layout technique that minimizes or eliminates cross coupling between audio amplifier channels caused by demodulation inductors spacing. It would be further advantageous if the layout technique provided a way to further minimize printed circuit board sizes associated with multi-channel audio amplifiers such as TDAAs.

SUMMARY OF THE INVENTION

The present invention is directed to audio amplifier output stage layout techniques to achieve minimum cross coupling between audio amplifier channels. Regarding TDAA output stages, the typical TDAA includes two demodulation inductors per audio channel. The two pair of demodulation inductors associated with the TDAA are arranged to form an X-pattern to simultaneously minimize cross coupling between audio amplifier channels and reduce PCB layout size.

According to one aspect of the invention, an audio amplifier output stage layout technique is implemented to reduce the amplifier size/power ratio.

In yet another aspect of the invention, an audio amplifier output stage layout technique is implemented to improve audio performance, i.e. minimize channel-to-channel cross coupling.

In still another aspect of the invention, an audio amplifier output stage layout technique is implemented to improve EMI performance due to minimal capacitive and inductive coupling between PCB tracks.

BRIEF DESCRIPTION OF THE DRAWINGS

Other aspects, features and attendant advantages of the present invention will be readily appreciated as the present invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Cross coupling between channels is a problem associated with audio amplifiers that employ conventional H-bridge output stage layouts for placing demodulation inductors. Unshielded demodulation inductors produce large stray fields requiring large physical channel-to-channel spacing on a PCB to avoid channel cross coupling. While this technique provides good audio performance with low THD, it also undesirably requires a large PCB area.

Shielded demodulation inductors produce very small stray fields allowing the inductors to be placed close to one another without cross coupling making such inductors desirable when PCB size must be reduced. Such inductors have a low saturation current level however, such that the THD is high at rising power levels, resulting in poor audio performance due to non-linear characteristics.

Figure 1:
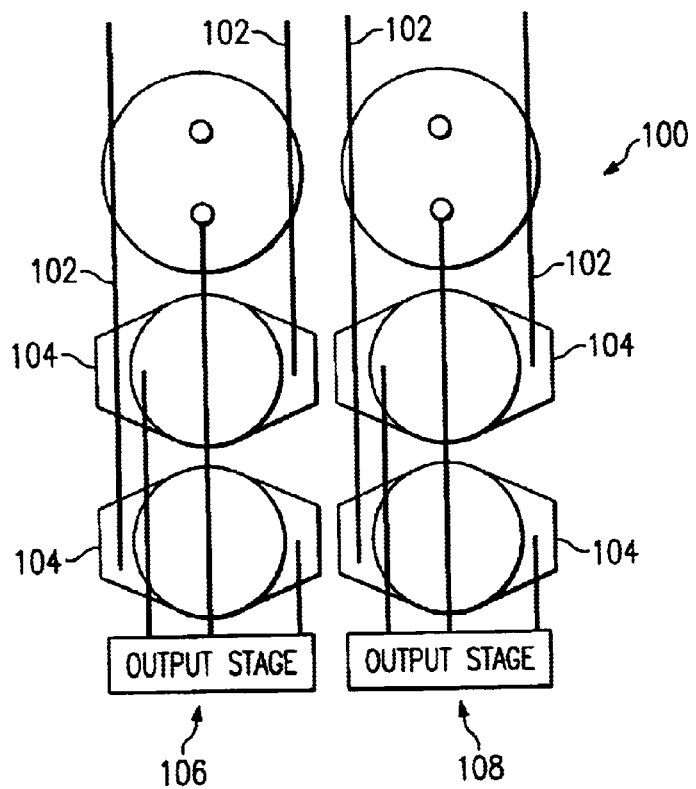
FIG. 1 is a pictorial illustrating a PCB layout having parallel tracks to position closely spaced inductors associated with different channels.

FIG. 1 is a pictorial illustrating a PCB layout 100 having parallel tracks 102 to position closely spaced inductors 104 associated with different channels 106, 108, associated with conventional H-bridge output stage routing. All power and output lines are routed via parallel tracks 102 on a narrow PCB area. Identical channels 106, 108 are placed side by side. PCB layout 100 undesirably produces high inductive and capacitive coupling due to parallel tracks 102, resulting in poor channel separation with respect to audio performance, among other problems. Initiatives to solve these problems have always resulted in additional components, driving up the cost, and/or larger PCB areas.

Figure 2:
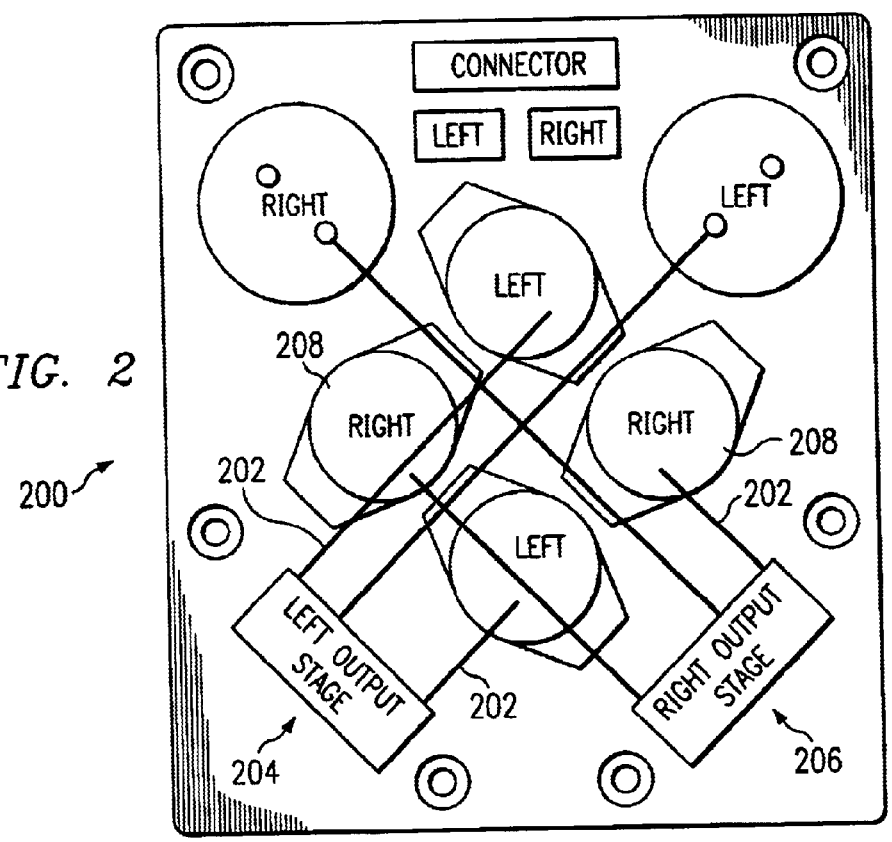
FIG. 2 is a pictorial illustrating a PCB layout having tracks positioned with a 90° angle between different channels having closely spaced inductors.

FIG. 2 is a pictorial illustrating a PCB layout 200 according to one embodiment of the present invention, and having tracks 202 positioned with a 90° angle between different channels 204, 206 having closely spaced inductors 208. PCB layout 200 can be very compact, even using open inductors; since inductive and capacitive coupling between tracks 202 (channel 204-to-channel 206) is minimized. The present inventor found that optimal inductor 208 placement is actually as close together as possible. PCB layout 200 was also found to provide better routing space to separate power tracks and output tracks within one channel. Those skilled in the art will appreciate that only two routing layers are sufficient to implement PCB layout 200.

Figure 3:
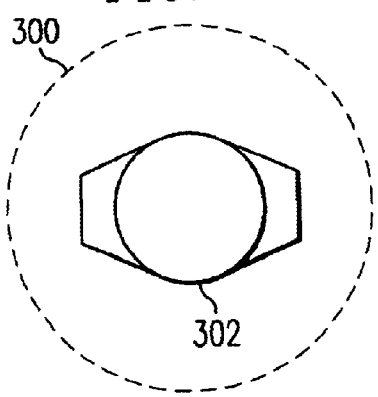
FIG. 3 is a pictorial illustrating the stray emission field caused by a single vertical bar-type inductor.
Figure 4:
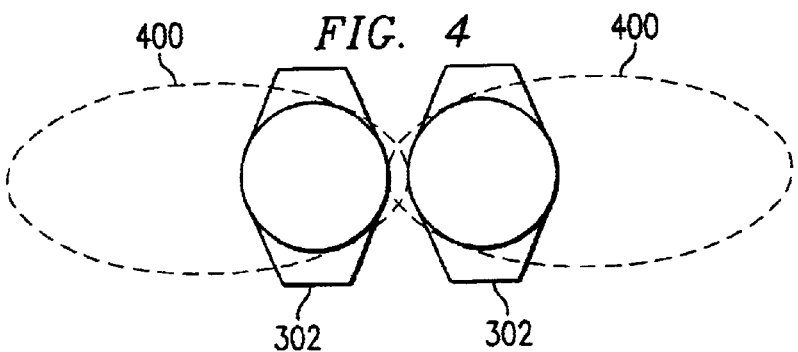
FIG. 4 is a pictorial illustrating the stray emission field caused by a pair of vertical bar-type inductors placed close to one another and coupled out of phase.
Figure 5:
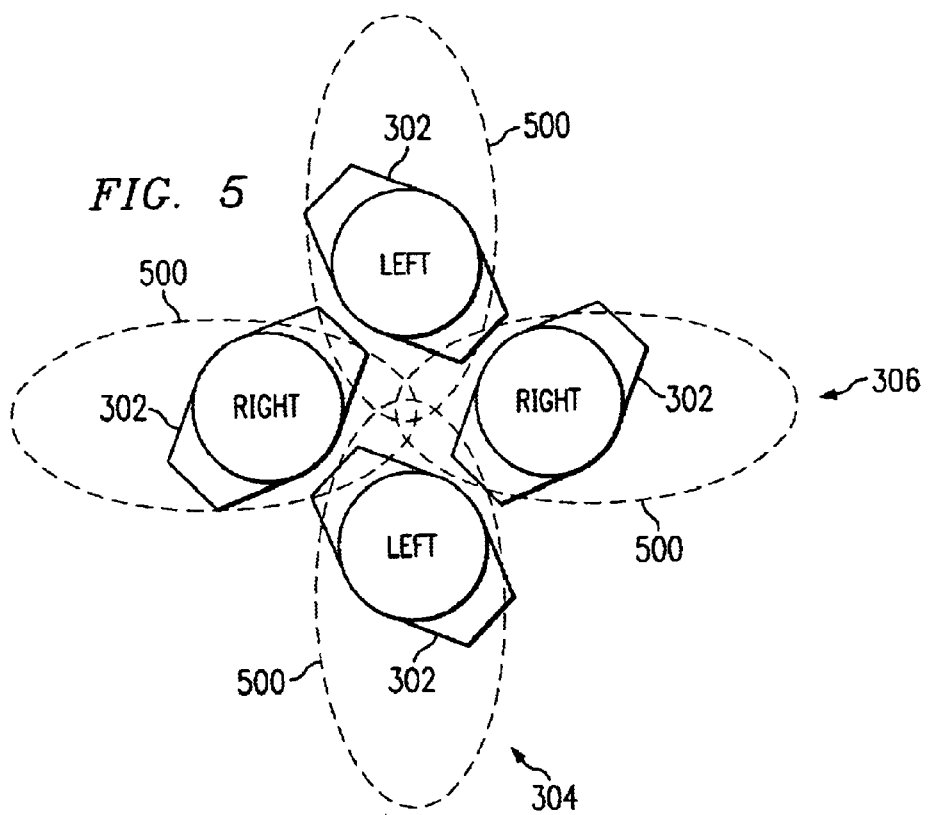
FIG. 5 is a pictorial illustrating the stray emission field caused by two pairs of vertical bar-type inductors placed close to one another in an X-pattern.

The present invention is better understood by the following discussion regarding stray fields associated with inductors and with reference to FIGS. 3–5, wherein FIG. 3 is a pictorial illustrating the stray emission field 300 caused by a single vertical bar-type inductor 302. The stray field 300, when viewed from the top of the inductor 302, has a shape that appears like the letter 'O'.

FIG. 4 is a pictorial illustrating the stray emission field 400 caused by a pair of vertical bar-type inductors 302 placed close to one another and coupled out of phase. The stray field 400, when viewed from the top of the inductors 302, has a shape that appears like the number '8'. When used in association with a BTL true digital audio amplifier (TDAA), the two demodulation inductors 302 will typically carry the same current.

FIG. 5 is a pictorial illustrating the stray emission field 500 when viewed from the top, caused by two pairs of vertical bar-type inductors 302 placed close to one another in an X-pattern. It is easy to see that channel 304-to-channel 306 coupling can be minimized if the 2×2 inductors 302 in a 2-channel output stage are placed in a pattern having a shape that appears like the letter 'X'. This is due to the reduction in overlap between stray emission fields 500 caused by each inductor 302.

In view of the above, it can be seen the present invention presents a significant advancement in the art of PCB layout associated with multi-channel audio output stages to minimize coupling between the output stages. This invention has been described in considerable detail in order to provide those skilled in the PCB layout art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims that follow.

What is claimed is:

1. A printed circuit board (PCB) output stage comprising:
 a PCB having a first output stage and a second output stage, wherein each output stage comprises a plurality of PCB tracks, and further wherein the plurality of PCB tracks associated with the first output stage are placed at a 90° angle with respect to the plurality of PCB tracks associated with the second output stage.

2. The PCB according to claim 1, wherein each output stage further comprises an identical pair of inductors, and further wherein the inductors are placed in an 'X' pattern such that the pair of inductors associated with one output stage forms one leg of the 'X' pattern, while the pair of inductors associated with the other output stage forms the other leg of the 'X' pattern.

3. The PCB according to claim 2, wherein the inductors are unshielded demodulation inductors.

4. The PCB according to claim 2, wherein each output stage is a true digital audio amplifier output stage.

5. The PCB according to claim 2, wherein the inductors are vertical bar-type inductors.

6. A printed circuit board (PCB) output stage comprising:
 a PCB having a first audio channel and a second audio channel, wherein each audio channel comprises a plurality of PCB tracks, and further wherein the plurality of PCB tracks associated with the first audio channel are placed at a 90° angle with respect to the plurality of PCB tracks associated with the second audio channel.

7. The PCB according to claim 6, wherein each audio channel comprises an output stage having a plurality of inductors, and further wherein the inductors are placed in an 'X' pattern such that the plurality of inductors associated with one output stage forms one leg of the 'X' pattern, while the plurality of inductors associated with the other output stage forms the other leg of the 'X' pattern.

8. The PCB according to claim 7, wherein the inductors are unshielded demodulation inductors.

9. The PCB according to claim 7, wherein the inductors are vertical bar-type inductors.

10. The PCB according to claim 7, wherein each output stage is a true digital audio amplifier output stage.

11. A printed circuit board (PCB) output stage comprising:
 a PCB having a first output stage and a second output stage, wherein each output stage comprises an identical pair of inductors, and further wherein the inductors are placed in an 'X' pattern such that the pair of inductors associated with the first output stage forms one leg of the 'X' pattern, while the pair of inductors associated with the second output stage forms the other leg of the 'X' pattern.

12. The PCB according to claim 11, wherein each output stage comprises a plurality of PCB tracks, and further wherein the plurality of PCB tracks associated with the first output stage are placed at a 90° angle with respect to the plurality of PCB tracks associated with the second output stage.

13. The PCB according to claim 11, wherein the inductors are unshielded demodulation inductors.

14. The PCB according to claim 11, wherein the inductors are vertical bar-type inductors.

15. The PCB according to claim 11, wherein each output stage is a true digital audio amplifier output stage.

16. A printed circuit board (PCB) output stage comprising:
 a PCB having a first audio channel and a second audio channel, wherein each audio channel comprises an identical pair of inductors, and further wherein the inductors are placed in an 'X' pattern such that the pair of inductors associated with the first audio channel forms one leg of the 'X' pattern, while the pair of inductors associated with the second audio channel forms the other leg of the 'X' pattern.

17. The PCB according to claim 16, wherein each audio channel comprises an output stage having a plurality of PCB tracks, and further wherein the plurality of PCB tracks associated with one output stage are placed at a 90° angle with respect to the plurality of PCB tracks associated with the other output stage.

18. The PCB according to claim 16, wherein the inductors are unshielded demodulation inductors.

19. The PCB according to claim 16, wherein the inductors are vertical bar-type inductors.

20. The PCB according to claim 17, wherein each output stage is a true digital audio amplifier output stage.

* * * * *